(12) United States Patent
Reid et al.

(10) Patent No.: US 8,064,351 B2
(45) Date of Patent: Nov. 22, 2011

(54) METHOD FOR DETECTING AND CORRECTING DATA ERRORS IN AN RF DATA LINK

(75) Inventors: Ivan Reid, Belfast (IE); Peter Mackel, Belfast (IE); David Caskey, Magherafelt (IE)

(73) Assignee: Schrader Electronics, Ltd., Rochester Hills, MI (US)

( * ) Notice: Subject to any disclaimer, the term of this patent is extended or adjusted under 35 U.S.C. 154(b) by 674 days.

(21) Appl. No.: 11/584,244

(22) Filed: Oct. 20, 2006

(65) Prior Publication Data

US 2009/0217137 A1    Aug. 27, 2009

Related U.S. Application Data

(60) Provisional application No. 60/728,661, filed on Oct. 20, 2005.

(51) Int. Cl.
*G06F 11/00* (2006.01)

(52) U.S. Cl. ........ 370/242; 714/699; 714/746; 714/798; 714/799

(58) Field of Classification Search .................. 370/241, 370/242; 714/746–824
See application file for complete search history.

(56) References Cited

U.S. PATENT DOCUMENTS

| | | | | |
|---|---|---|---|---|
| 5,170,396 A | * | 12/1992 | Rivers et al. | 714/709 |
| 5,701,329 A | * | 12/1997 | Croft et al. | 375/224 |
| 6,061,826 A | * | 5/2000 | Thirumoorthy et al. | 714/784 |
| 2002/0044050 A1 | * | 4/2002 | Derbyshire et al. | 340/442 |
| 2006/0156180 A1 | * | 7/2006 | Kang | 714/758 |
| 2007/0089036 A1 | * | 4/2007 | Jiang | 714/774 |

* cited by examiner

*Primary Examiner* — Hassan Kizou
*Assistant Examiner* — Charles Jiang
(74) *Attorney, Agent, or Firm* — T. A. Dougherty, Esq.; J. A. Thurnau, Esq.; P. N. Dunlap, Esq.

(57) ABSTRACT

Methods for detecting and correcting data errors in an RF data link include identifying valid data frames and corrupted data frames by measuring a data corruption level for each transmitted data frame, comparing the measured data corruption level for each corrupted data frame to a data corruption threshold, reconstructing the corrupted data frames having a data corruption level below the data corruption threshold, reconstructing the data block using data from valid and reconstructed data frames, and/or verifying the data in the reconstructed data block.

21 Claims, 18 Drawing Sheets

METHOD FOR DETECTING AND CORRECTING DATA ERRORS IN AN RF DATA LINK

CROSS REFERENCE TO RELATED APPLICATION

This application claims priority to U.S. Provisional Patent Application Ser. No. 60/728,661, filed Oct. 20, 2005, entitled METHOD FOR DETECTING AND CORRECTING DATA ERRORS IN AN RF DATA LINK, which is also incorporated herein by reference.

BACKGROUND OF THE INVENTION

1. Field of the Invention

The present invention relates to RF data links in which data is sent from one or more RF transmitters to one or more RF receivers in a data format utilizing data frames and blocks. More particularly, this invention pertains to methods of improving the quality of data sent across an RF data link as used in a remote tire pressure monitoring systems and the like.

2. Description of the Prior Art

Remote tire pressure monitoring systems (TPMS) are used in motor vehicles to provide accurate tire pressure information to the driver in real time. A typical TPMS will have a pressure sensor mounted in each wheel, with an RF transmitter coupled to each sensor. The transmitter receives pressure data from its corresponding sensor and sends the data to a receiver. The receiver is under the control of a processor which then decodes the data and communicates the tire pressure information to the driver.

Preferably, the RF data link between the transmitter and receiver is configured to send digital data. Thus, each RF signal is formatted as a data frame. Each frame of data transmitted by a wheel sensor/transmitter in a remote tire pressure monitoring system includes a sequence of bits sometimes referred to as a data record, word or character. The frame may contain information corresponding to the tire/wheel identifier which uniquely identifies the sensor/transmitter combination, and tire data, such as data corresponding to the measured tire pressure of the tire. This data is sometimes referred to as the "payload." Other information, such as a frame header or synchronization data may be transmitted as part of the frame. Multiple frames of data forming a data block may be transmitted during respective time periods. For example, a data block may contain eight frames of data sent during eight time periods. Data blocks are preferably repeated in the TPMS at an update frequency. The update frequency may be selected to be on the order of seconds, minutes or hours, or any other suitable rate. Also, the update frequency may be varied depending on the mode of operation such as when the wheel is stationary or rolling.

A frame or block of data is conventionally subjected to some type of error detection by the processor in the TPMS. For example, a checksum step is a basic error-detection technique in which each transmitted frame or block includes a numerical value based on a number of set bits in the frame or block as determined by a checksum algorithm (e.g., CRC) in the transmitter. The receiver then applies the same checksum algorithm to the received frame or block to determine if the numerical value calculated from the received data matches the transmitted numerical value. If it does not, the processor can assume that the received data has been corrupted.

The RF data link in a TPMS must operate in a harsh environment that is electrically noisy. The strength of the transmitted signal can be degraded by ambient conditions. Accordingly, it is common for the transmitted data to be corrupted or garbled. Data bits can be dropped or incorrectly sent, resulting in invalid data, no data, and/or slow processing time at the receiving end. Certain invalid data is sometimes referred to as "implausible" because its value falls outside a range of what could reasonably be expected during normal operation of the system.

Attempts have been made in the prior art to improve the quality of the RF data link in TPMS. These have included hardware changes to either the TPMS wheel transmitter or TPMS receiver to improve the RF signal quality of the RF link itself. Other efforts have focused on providing more protection in the transmitter against spurious readings of temperature and pressure (EMC, ASIC filtering, etc). Unfortunately, these solutions have not been entirely satisfactory and any solution that adds hardware to the system will increase the cost of the system.

SUMMARY

The present invention is directed to systems and methods which provide robust reconstruction of wireless transmission data frames and blocks, such as TPMS frames and blocks, that have been corrupted as a result of poor quality of received RF data. Preferably the present methods and systems are implemented in or though software, firmware or, other programmable mediums. A further data filtering algorithm may also be employed on the information contained in the frames and blocks. These software algorithms help to insure that the information received is plausible and consistent with the information transmitted.

In one embodiment, a method of the present invention includes four basic steps or procedures. In a first step, the number of, and position of, any invalid bits in a transmitted data frame, such as a TPMS frame, is detected. To perform this step, when the RF data frame is being decoded, any invalid bits are detected using edge detection windows. The location and width of these windows are configurable in software. In order to ensure accurate timing, the software preferably resynchronizes on each bit. All the values of each bit, along with their validity status are preferably recorded and stored.

In a second step, the data frame (TPMS frame) is reconstructed using a CRC eight bit error validation technique, or the like. Using the information obtained from step one, the degree of data corruption can be determined. The software preferably allows for user configuration of an acceptable level of corruption. The data validity bits may then be used to simplify the reconstruction algorithm. Trial solutions may be reduced from 2M to 2N, where M is the total number of bits in the payload and checksum and N is the number of invalid bits in the payload and checksum. Other possible solutions may be determined by using previously known pressure and temperature ranges (also configurable in software). Then, software algorithms may be used to reconstruct the frame.

In a third step, the data block (TPMS data block) may be reconstructed. Using information obtained from valid and reconstructed frames, the correct information for the block may be deciphered. Further algorithms may be used to check for data consistency, majorities, plausibility, etc.

In a fourth step, the data may be filtered and verified. This is accomplished by comparing information stored from previous data blocks with the information from the current block information to insure plausibility of the data before using it, such as in TPMS application modules and publishing the information on a vehicle data bus.

Embodiments of methods of the present invention can be implemented purely in software, firmware, or the like, making it faster to implement and change. It is a less expensive alternative to a hardware changes. It is easily configurable merely through software changes, firmware updates, or the like. The method can be used in any RF data link that incorporates a robust checksum in the payload.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

The accompanying drawings, which are incorporated in and form part of the specification in which like numerals designate like parts, illustrate embodiments of the present invention and together with the description, serve to explain the principles of the invention. In the drawings.

DETAILED DESCRIPTION

Figure 6:
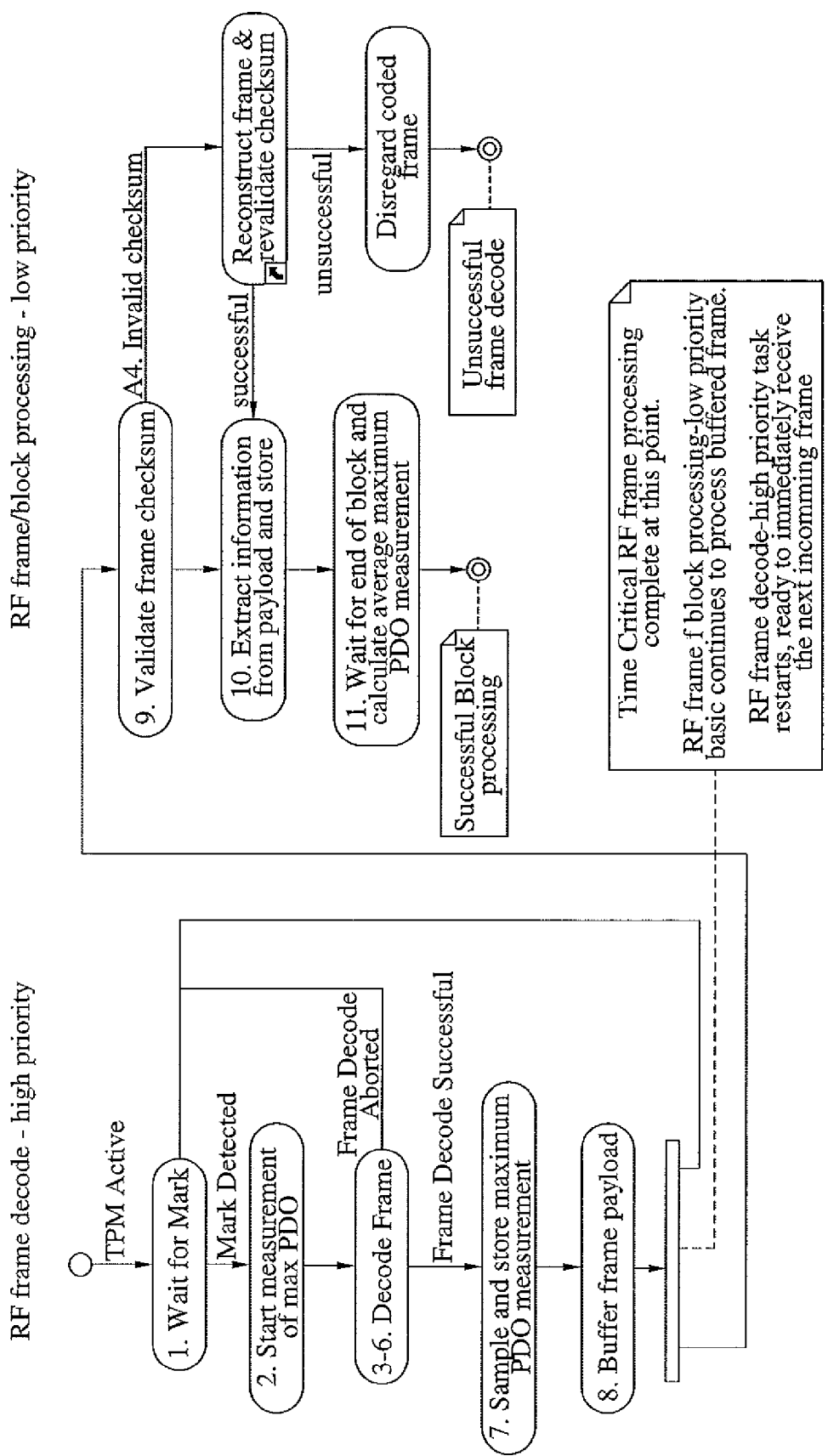
FIG. 6 is a high level activity diagram showing the decoding and error correcting of data frames and blocks in accordance with an embodiment of a method of the present invention.

The steps and procedures of method embodiments generally described below are characterized in the flow charts shown in FIGS. 6-15. FIG. 6 is a flow chart and FIG. 12 is a sequence diagram illustrating at a high level the basic steps of an embodiment of a method of the present invention, which are preferably implemented in software, firmware, or other programmable medium. Embodiments of methods of the present invention are herein described with respect to a TPMS RF signal represented by a data frame and blocks. However, embodiments of the present invention may be employed with any number of RF signals employing data frames and blocks.

As detailed below, various embodiments of the present invention may include a number of steps including the following. Manchester encoded data frames or the like are received over a wireless link, such as may be provided in a TPMS and wherein the data frames have checksums and are comprised of symbols, the symbols each having a symbol period. Errors in the received data frames my be detected by determining whether each symbol is present in the received data frame, wherein each data error has a location in the received data frame and the presence of each symbol is detected by utilizing edge detection windows having a duration of one symbol period. The symbols in the received data frame may be marked as data errors if the edge detection window closes without a symbol being detected. The location of each data error may be stored in a system memory. Data frames may be discarded if the number of data errors exceeds a programmable threshold level. It may be determined if the data frames are correctable by utilizing a data correction algorithm, such as a cyclic redundancy check algorithm, wherein the data correction algorithm recalls and changes only the data errors in an attempt to satisfy the checksum so that the number of iterations used by the data correction algorithm in attempting to satisfy the checksum is reduced by not attempting iterations with changes to known good data. All modified data frames that satisfy the checksum may be stored to the system memory. In accordance with some embodiments of the present invention if the number of data errors exceeds a fixed number, such as four data errors, the received data frames may be discarded. The received data frames may be corrected if only one modified data frame satisfies the checksum. All other remaining data frames may be discarded as uncorrectable. Finally, the corrected data frames may be validated against programmable boundary thresholds.

Figure 1:
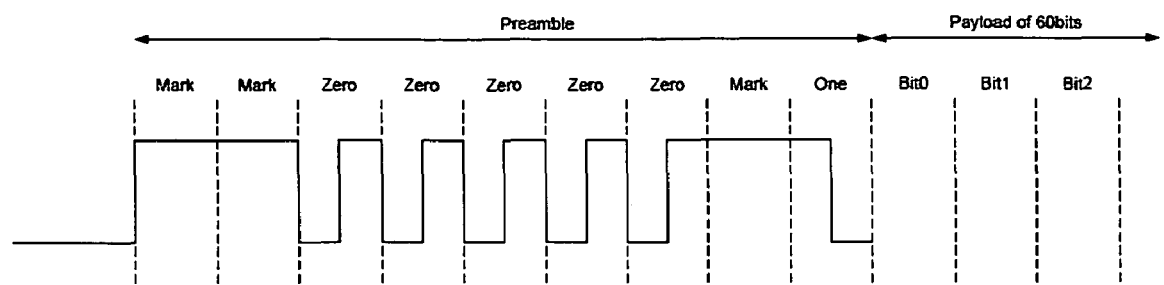
FIG. 1 is a graphical representation of the preamble and payload portions of one example of a TPMS or similar data frame.
Figure 2:
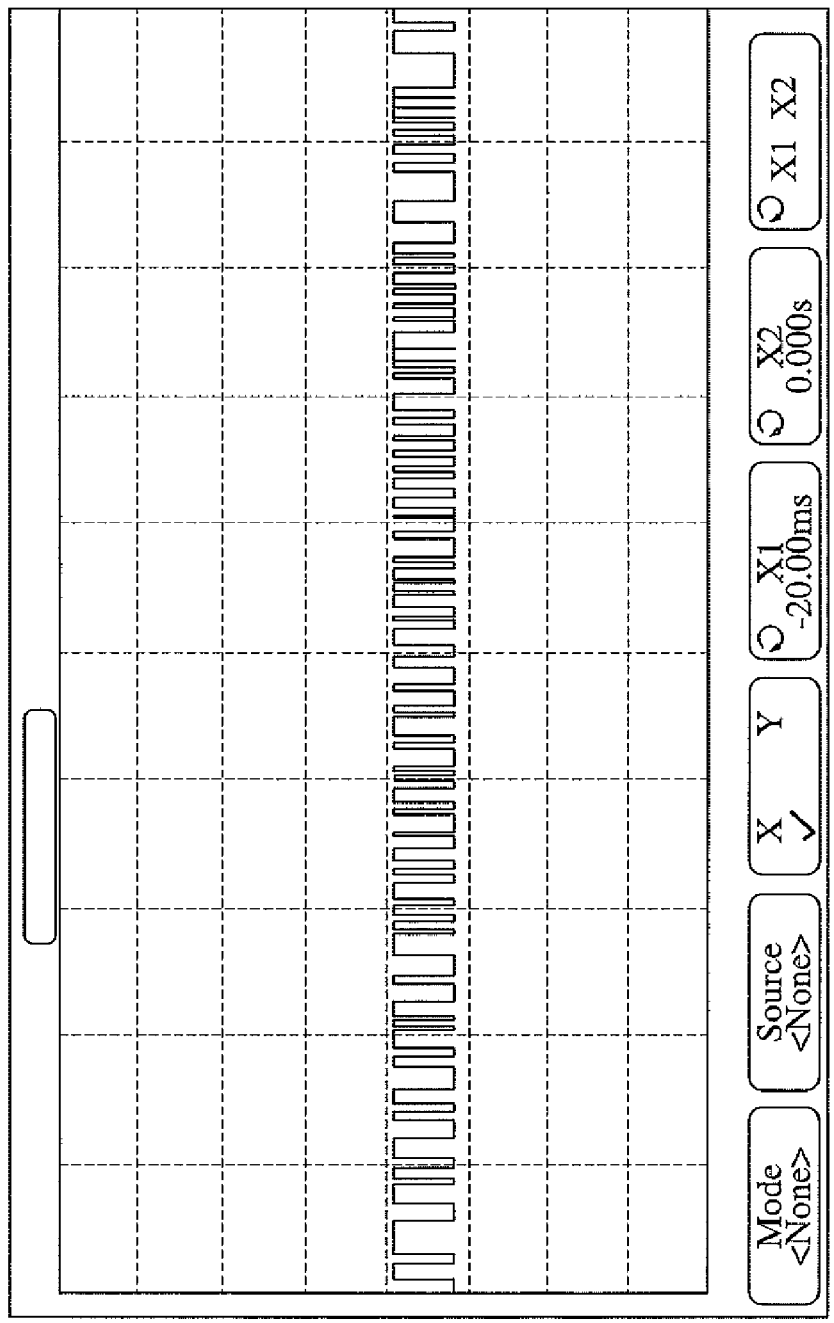
FIG. 2 is a graphical representation of an RF data line from a TPMS receiver or the like, with no RF activity from a (TPMS) transmitter.
Figure 3:
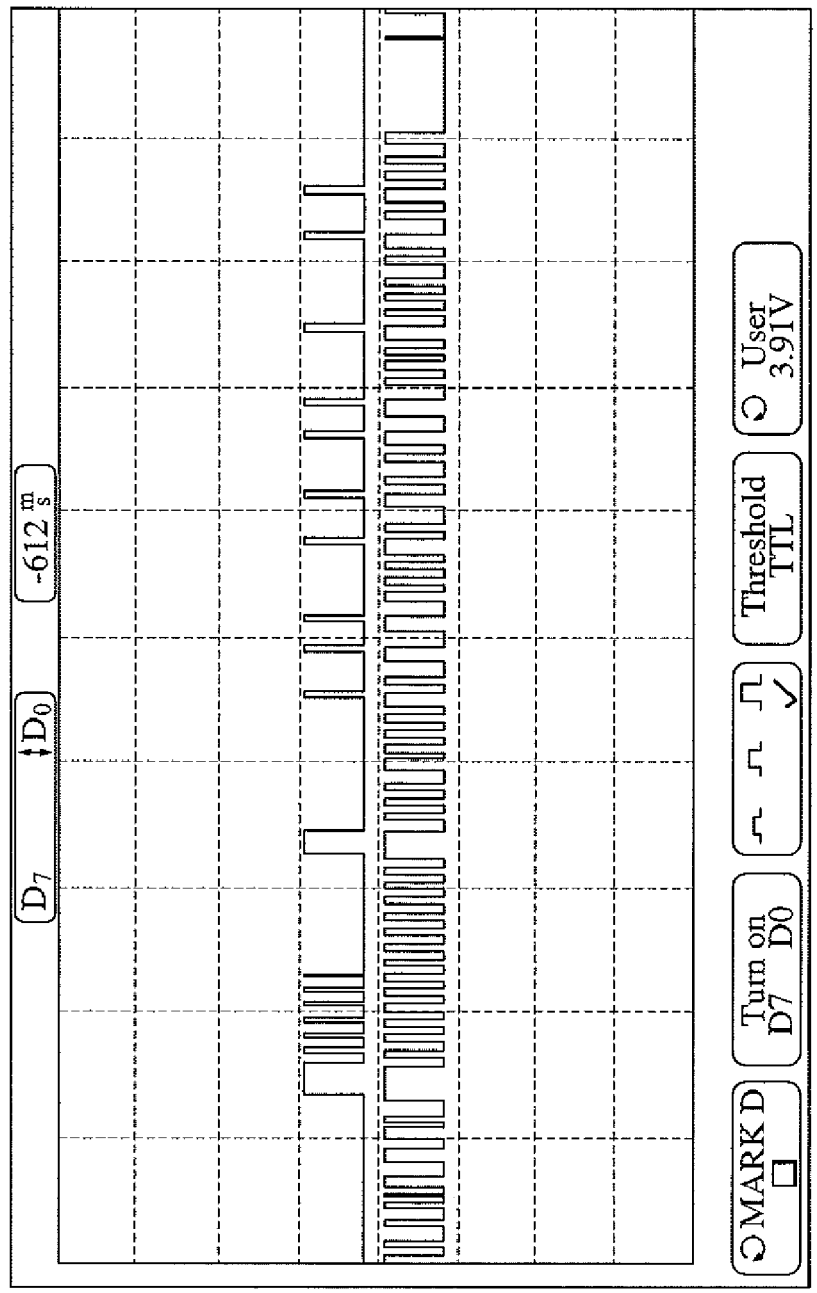
FIG. 3 a graphical representation of an RF data line from a TPMS receiver or the like, with RF activity from the (TPMS) transmitter and further showing a triggering of an RF mark detect line.

As illustrated in FIG. 1, a TPMS RF data frame comprises a sequence of symbols or bits defining a preamble followed by a payload of M bits or symbols. The first step in decoding the RF data is to detect the start of a frame so that the TPMS processor can prepare itself to decode the entire frame. FIG. 2 shows a received RF data line with no RF activity by the TPMS transmitter. As can be seen, the RF section in the TPMS receiver is constantly picking up noise. Because of this, it would be impossible for the TPMS processor to monitor every pulse on the RF data input line for the correct pulse width. Thus, in accordance with the present invention system hardware (e.g., in the vehicle Electronic Control Unit) preferably supplies a mark detect circuit that will trigger on detecting the correct pulse width and power level for a double mark. FIG. 3 shows a received RF data line with TPMS transmitter RF activity. FIG. 3 also shows triggering of the RF mark detect line. Because the TPMS processor is not constantly processing noise in the received RF data line searching for the start of a RF frame, the processing load on the TPMS processor and/or similar equipment is decreased.

With attention directed to FIG. 6, after the TPMS is activated, software in the TPMS processor causes the processor to (1) wait until a mark is detected. When a mark is detected, (2) measurement of maximum peak detect output (PDO) is started. Following mark detect, a stream of Manchester encoded payload data is sent to the TPMS processor and (3)-(6) decoding of the frame begins. The mark detect circuitry can be sensitive, so the preamble should be validated to ensure that it actually represents the start of a TPMS RF data frame. Therefore, as seen on FIG. 7, frame decoding includes (3) validation of the preamble of the data frame. The first and second parts of the preamble are validated using different procedures and/or programmable boundary parameters.

Figure 7:
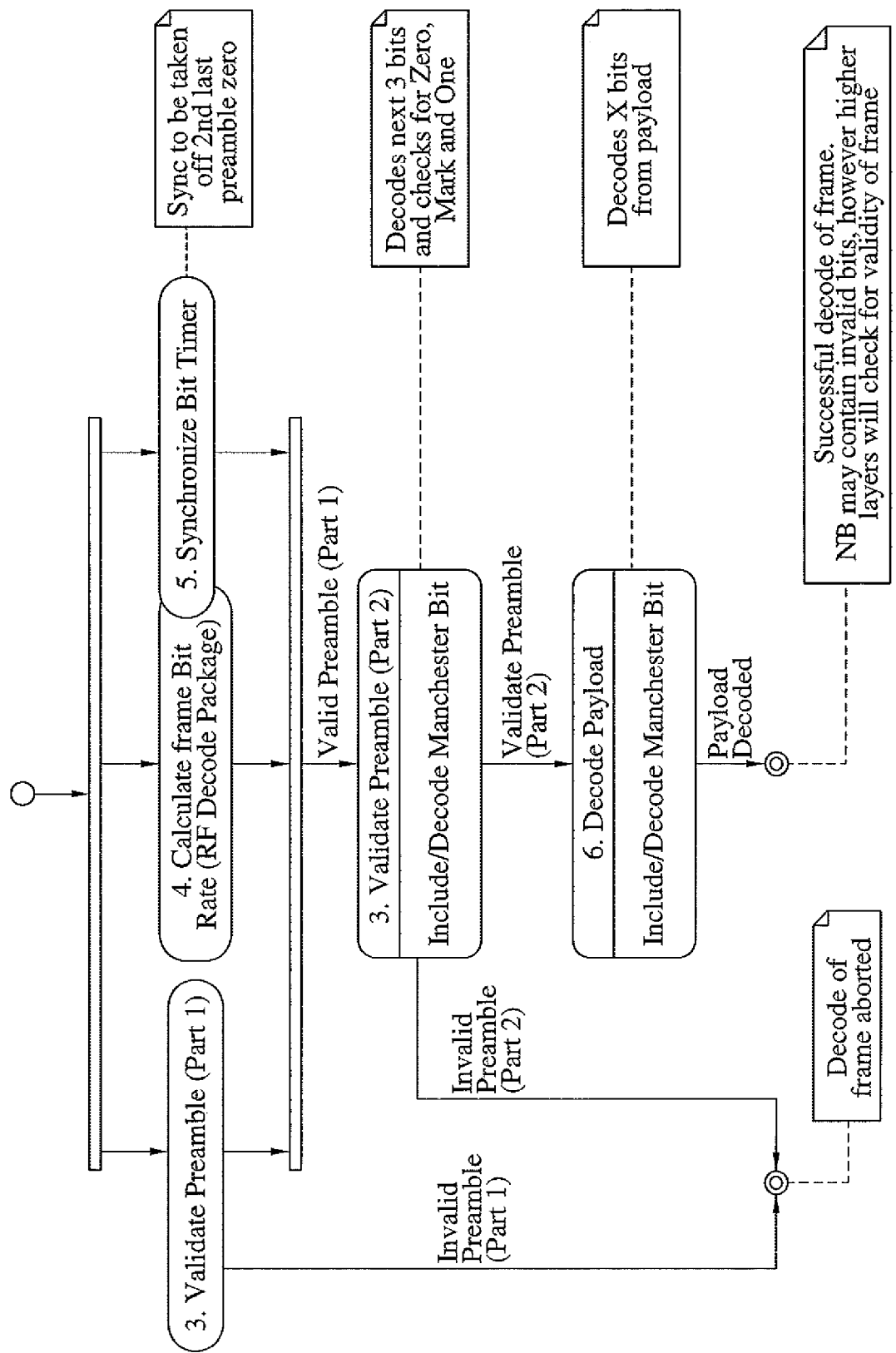
FIG. 7 is an activity diagram of the frame decoding steps used in the method of FIG. 6.
Figure 8:
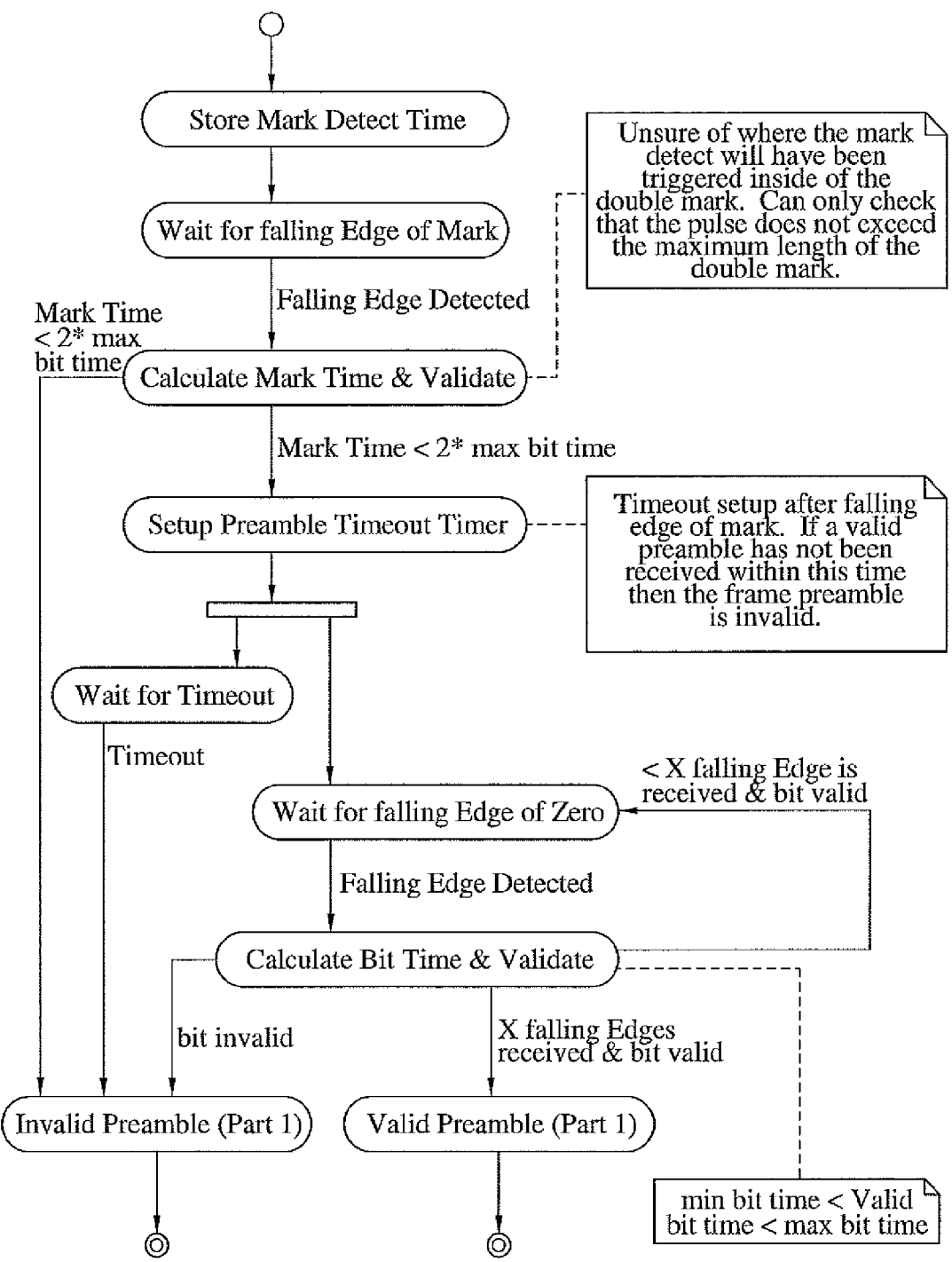
FIG. 8 is an activity diagram showing the procedure to validate the first part of a data frame preamble as used in the method of FIGS. 6 and 7.
Figure 13:
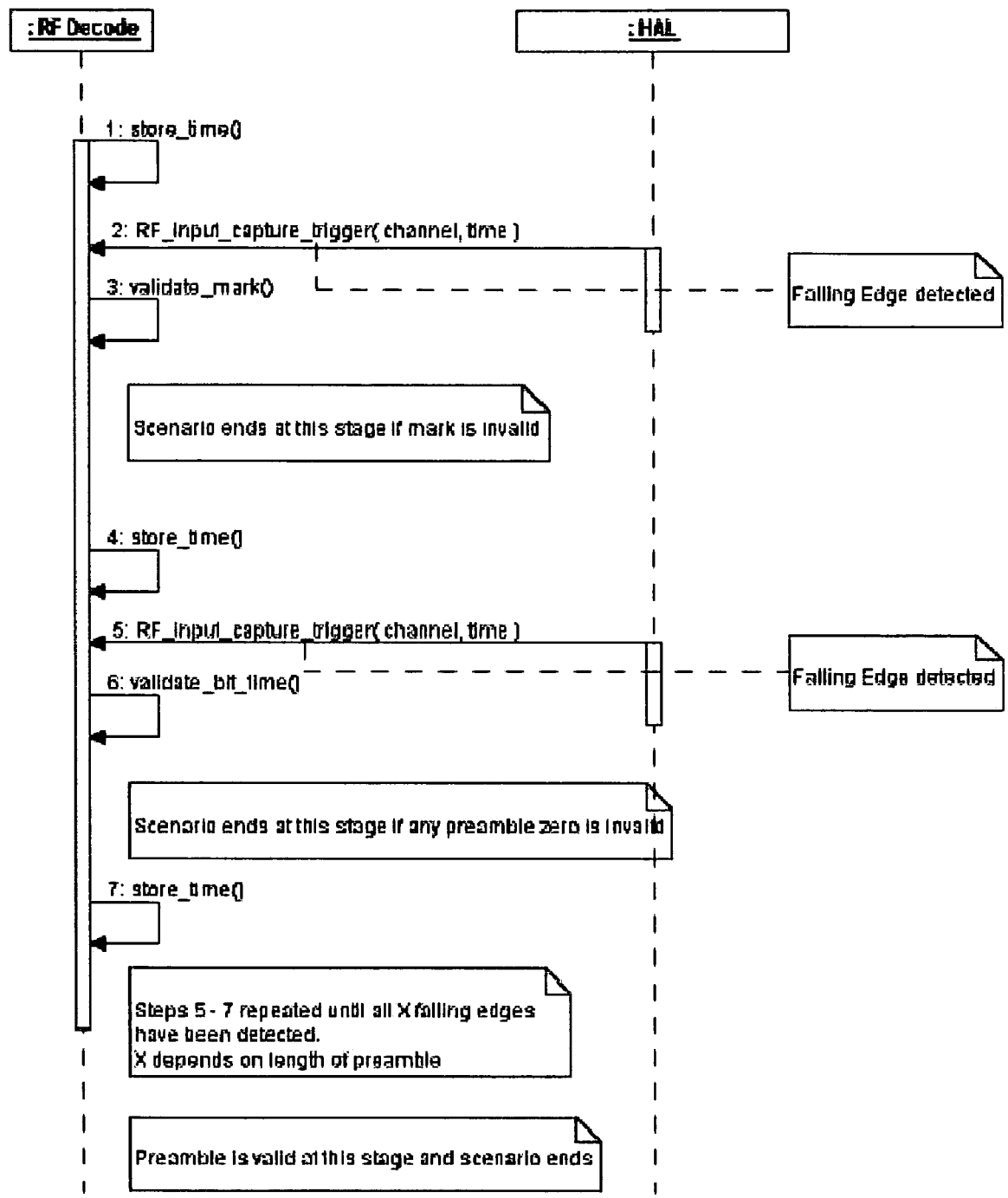
FIG. 13 is sequence diagram showing an embodiment of a procedure to validate a first part of a data frame preamble, as used in the method of FIGS. 6 and 7.

Referring to FIG. 7, the mark detect circuitry will trigger at a position within the double mark that is not predictable. Consequently, a check can be made that validates the maximum pulse width. This procedure (validation of the first part of the preamble) is shown in FIGS. 8 and 13. The width of a double mark is expressed as follows:

DOUBLE MARK WIDTH<(2*NOMINAL BIT WIDTH*TOLERANCE)

Transmitters in some different TPMSs use different protocols, but use the same carrier frequency, the same or similar data rate, and a similar frame preamble. Therefore, it is desirable to filter out signals from transmitters that do not use the specified system protocol because they are of no use to the subject system. Also, it is desirable to insure that there are only a specific number of zeros, or other indicator, appears in the preamble of the data frame.

Figure 9:
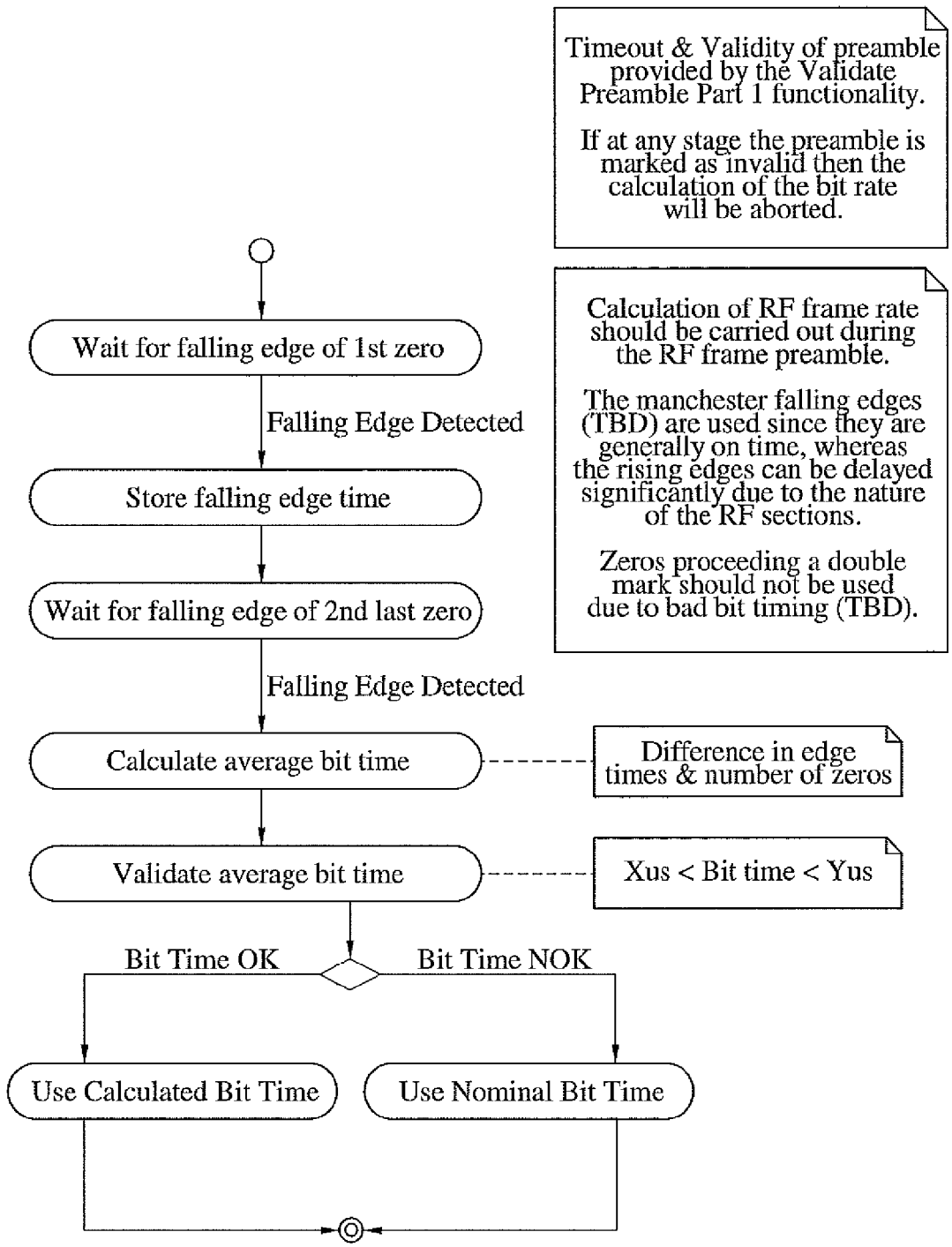
FIG. 9 is an activity diagram showing calculation of the data bit time as used in the method of FIGS. 6-8.
Figure 14:
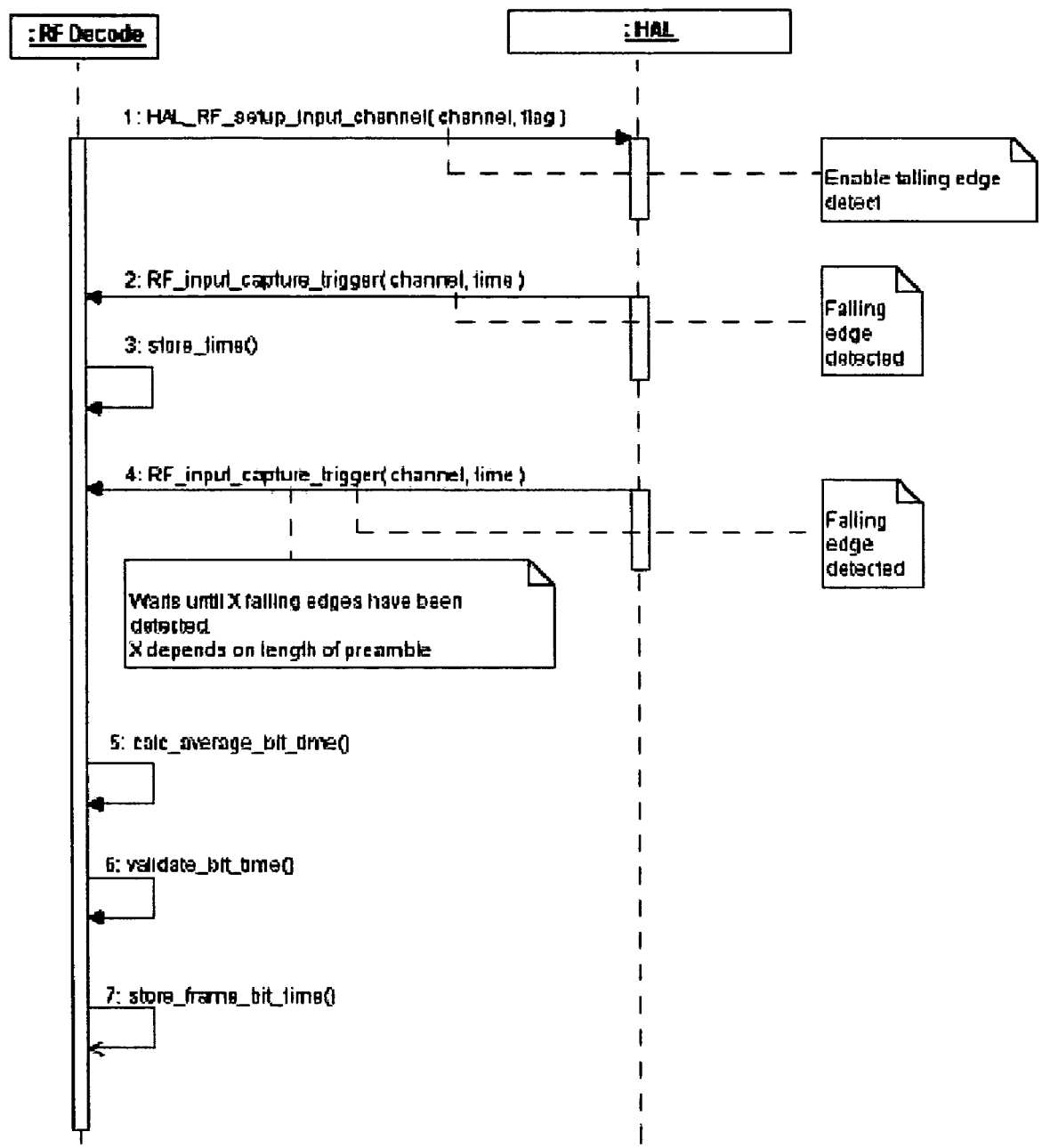
FIG. 14 is a sequence diagram of the bit time calculation procedure used in embodiments of methods of the present invention and as shown in FIG. 9.
Figure 15:
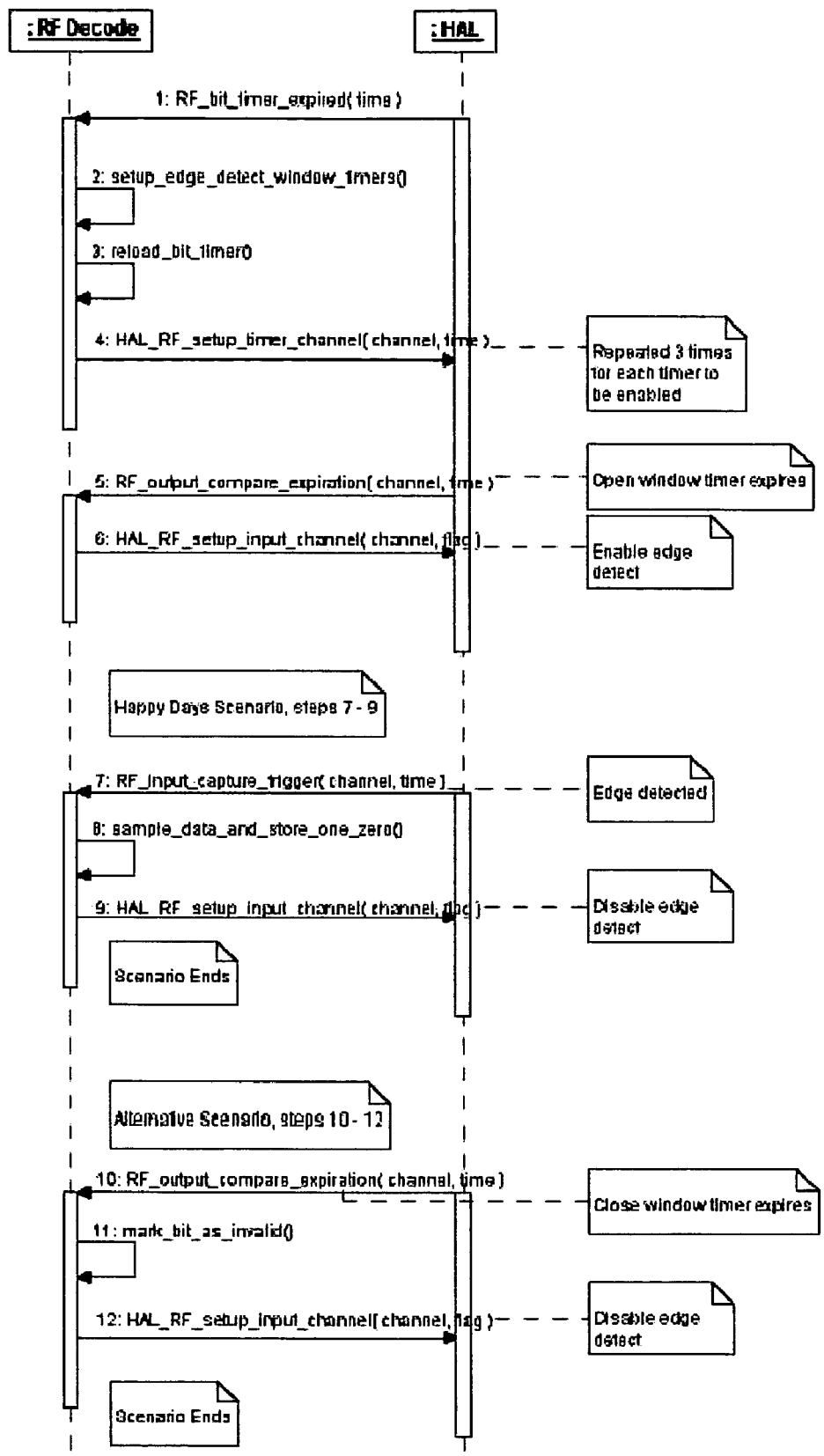
FIG. 15 is a sequence diagram of the Manchester bit decoding procedure as used in embodiments of methods of the present invention and as shown in FIG. 10.

As shown in FIG. 7, the bit timing of the zeros in the preamble may also be calculated and validated as part of the validation of the first part of the preamble. This is shown in FIGS. 9 and 14. The Bit Width=(nominal bit width±tolerance). As seen in FIG. 9, the average bit time (bit width) may be calculated by detecting the falling edges of the first zero and the second to last zero in the first part of the preamble. If the calculated average bit time is within tolerances (as established in the TPMS software), the calculated bit time may be used. Otherwise, the nominal bit time may be used.

Figure 10:
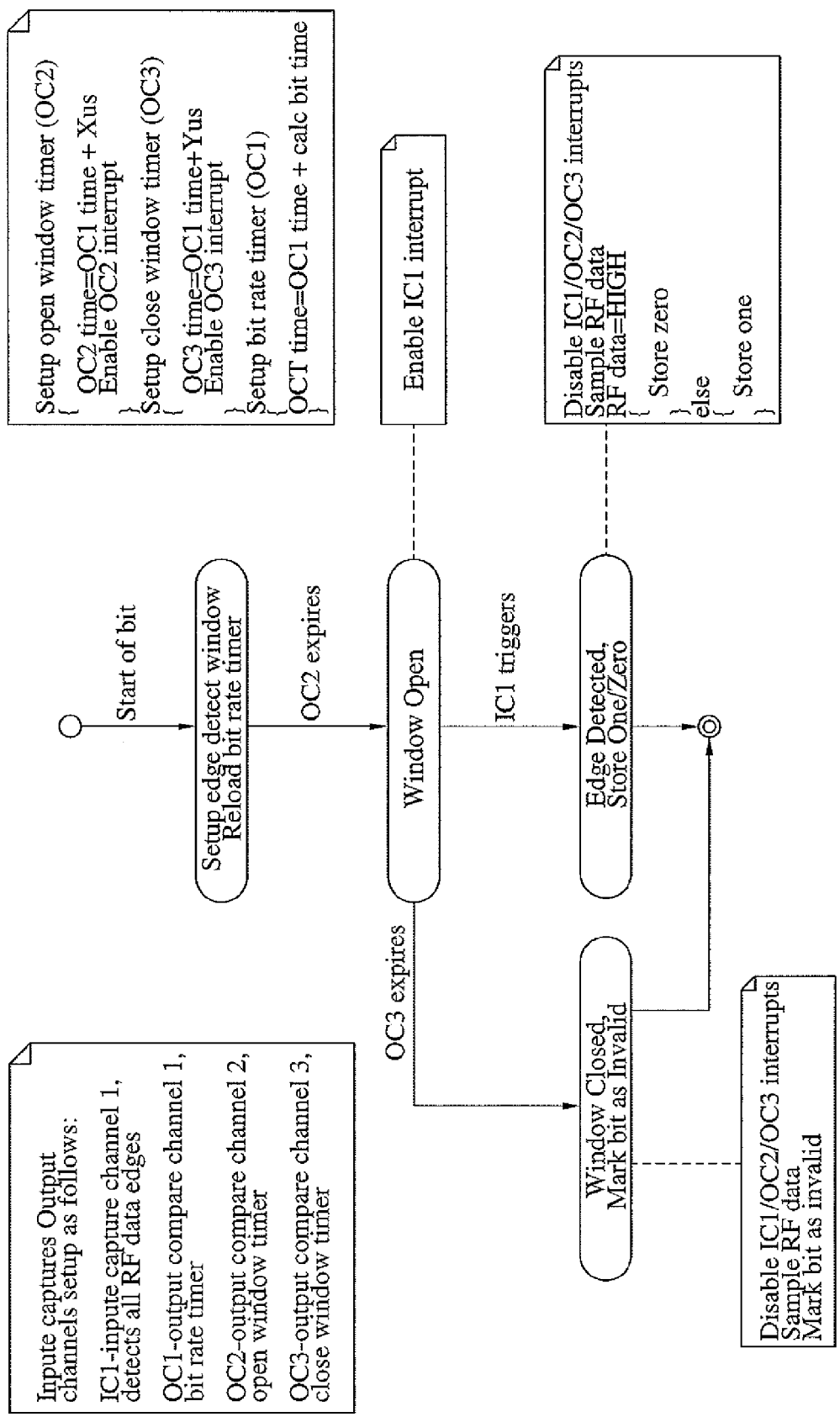
FIG. 10 is a flow chart showing decoding of Manchester encoded data bits as used in the method of the present invention.

Looking at FIGS. 7 and 10, the second part of the preamble can be validated (3) by decoding the next three bits in the preamble as Manchester encoded bits and looking for a zero, mark and one. Decoding of Manchester encoded bits is described in more detail below. If either of the preamble validations fails, the preamble may be reported as being invalid.

Referring back to FIGS. 6 and 7, synchronization (5) of the bit timer used for transmitted and received data must be performed. Empirical data has showed that bit timing can be off significantly immediately after a large pulse, i.e. a double mark, zero, mark, one. Thus, synchronization may preferably be initiated on the falling edge of the second to last preamble zero as shown on FIG. 9. This timer may indicate the start of a Manchester bit. To enable this timer to consistently activate in the correct place, the (4) bit rate of the incoming frame should be known. One example of a TPMS transmitter uses an RC oscillator for its timing so the bit rate will vary over temperature 4.096 kHz±5%. However, because the length of a frame is short approx 16 ms, the bit rate of the frame will be constant over the period of that frame, as the temperature cannot change significantly during in such a time frame.

As shown on FIGS. 8 and 13, the time between the falling edge of the first preamble zero and the falling edge of the fourth preamble zero is measured. The bit rate of the incoming frame can then be calculated down to an accuracy of 2-3 us. However over the period of one frame (60+ bits), the bit timer will be significantly off time and so should be resynchronized periodically, as described below.

Figure 4:
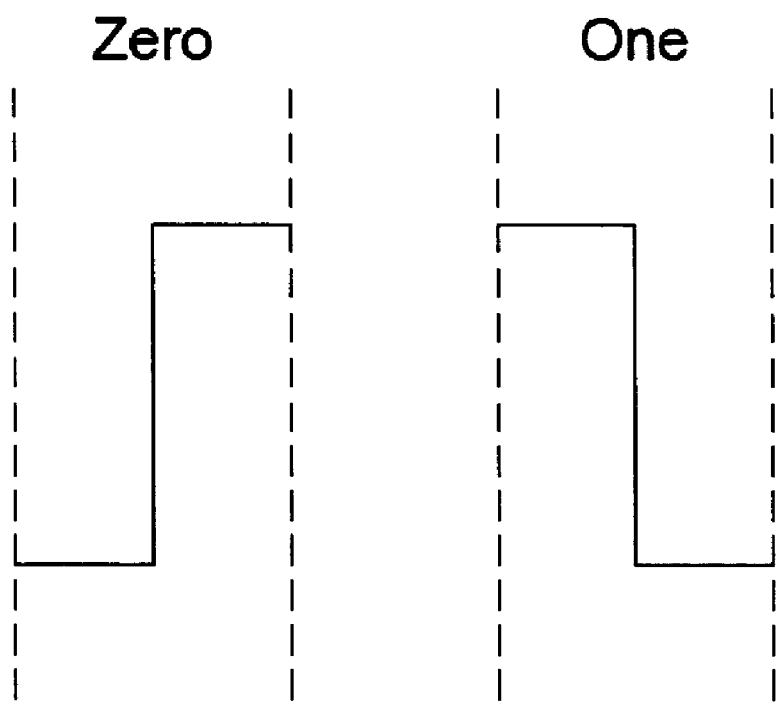
FIG. 4 is a graphical representation of Manchester encoded zero and one bits.
Figure 5:
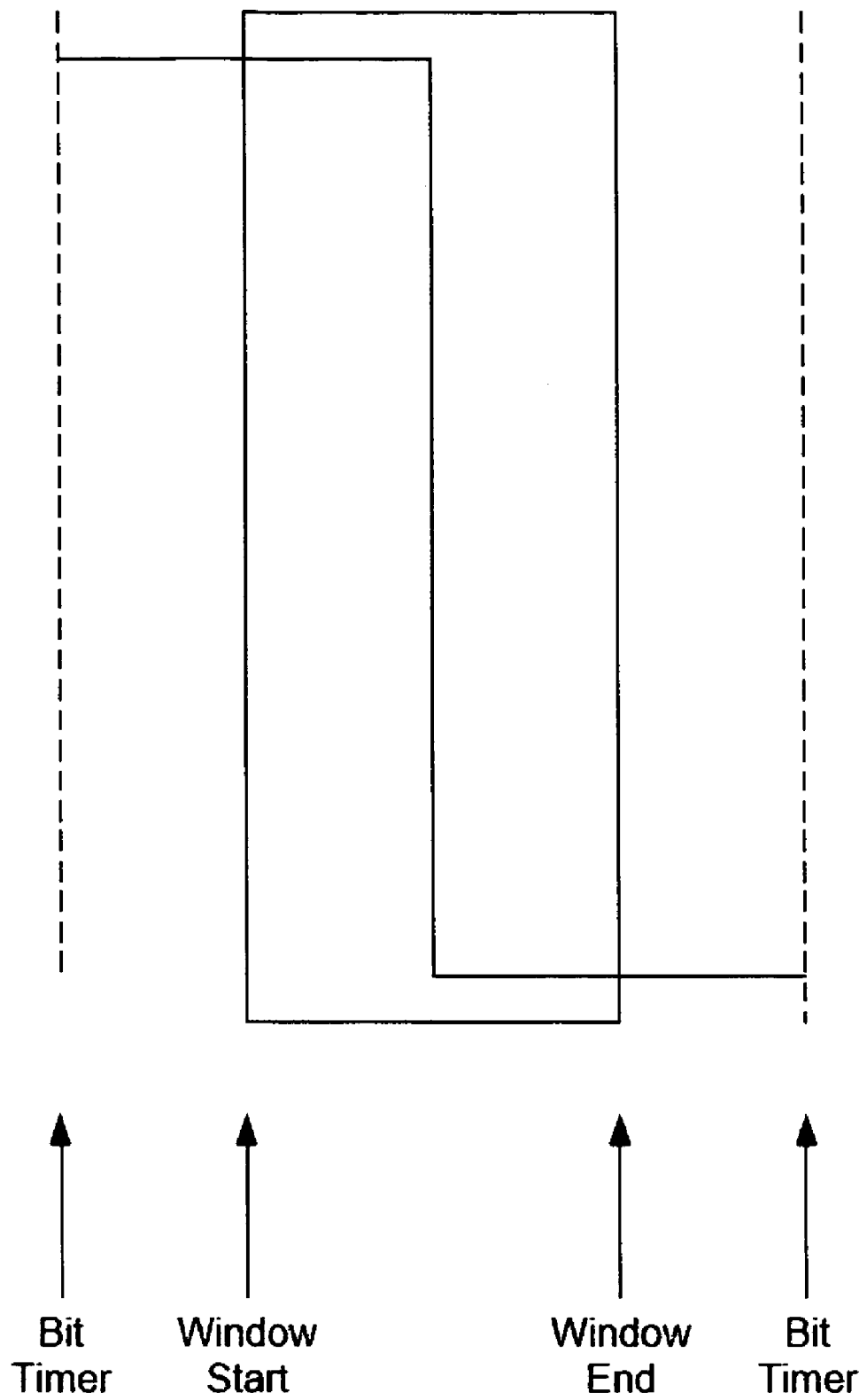
FIG. 5 is a graphical representation of an edge detection window opened inside a Manchester encoded bit to enable sampling of the RF data line during the time period within the edges of the window.

A characteristic of Manchester encoding is that a transition occurs in the middle of the bit. A rising edge corresponds to a Manchester Zero and a falling edge corresponds to a Manchester One. (FIG. 4) To decode each Manchester bit, a window is preferably opened inside of the bit as described in FIGS. 10 and 15. Inside this window, edge detect is preferably enabled. Outside of this window, edge detect will preferably be disabled. This is illustrated in FIG. 5. When an edge is detected inside of the window, the RF data line is sampled in accordance with embodiments of the present invention immediately after the edge to find out if the bit was a zero or one. If the window is closed without an edge occurring then the bit is preferably marked as invalid.

As noted above, the oscillator driving the bit timer in a TPMS system can drift and the bit time can only be calculated to a certain accuracy. Consequently, as seen on FIG. 7, the bit timer is preferably resynchronized in (5) in accordance with the present invention. The bit timer can be resynchronized on receiving a valid edge by reloading the bit timer with half the calculated bit time. This will mean that for the next bit, the edge should occur in the middle of the bit, thereby keeping the bit timer in synchronization.

As seen on FIGS. 6 and 7, decoding of bits in a frame continues until the entire frame payload has been decoded. As seen on FIG. 6, after a frame has been decoded, the (7) maximum PDO measurement is sampled and stored. This point represents an end of time-critical section of the RF decoding in the example TPMS receiver. The frame can now be (8) buffered and passed to a lower priority task as shown on FIG. 6 and processing of buffered frames can now begin.

Processing of the buffered data frames includes attempts to reconstruct frames with any bits marked as invalid. These include frames initially determined (9) to have invalid checksums. If the frame is reconstructed and the frame checksum is successfully revalidated, the frame payload information is (10) extracted and stored. If frame reconstruction is not possible then the frame is discarded. The frame reconstruction procedure is shown on FIG. 11. The frame checksum is calculated and any frames with invalid checksums are discarded. If the frame is not discarded, the information contained in the frame (transmitter ID, function code, pressure, temperature and checksum) is then stored in a system memory and a timer is started.

Figure 11:
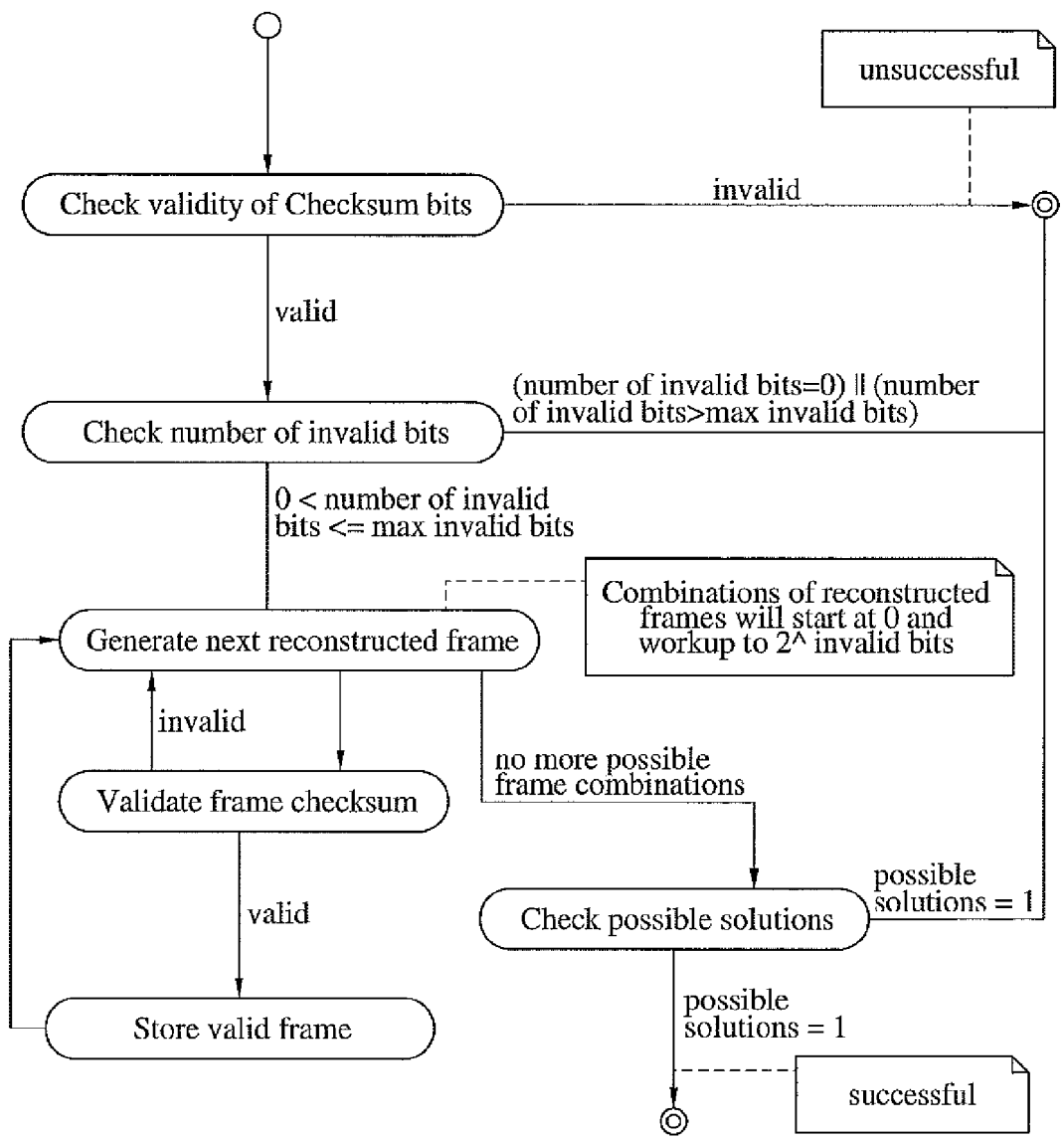
FIG. 11 is an activity diagram showing the frame reconstruction procedure as used in the method of the present invention.
Figure 12:
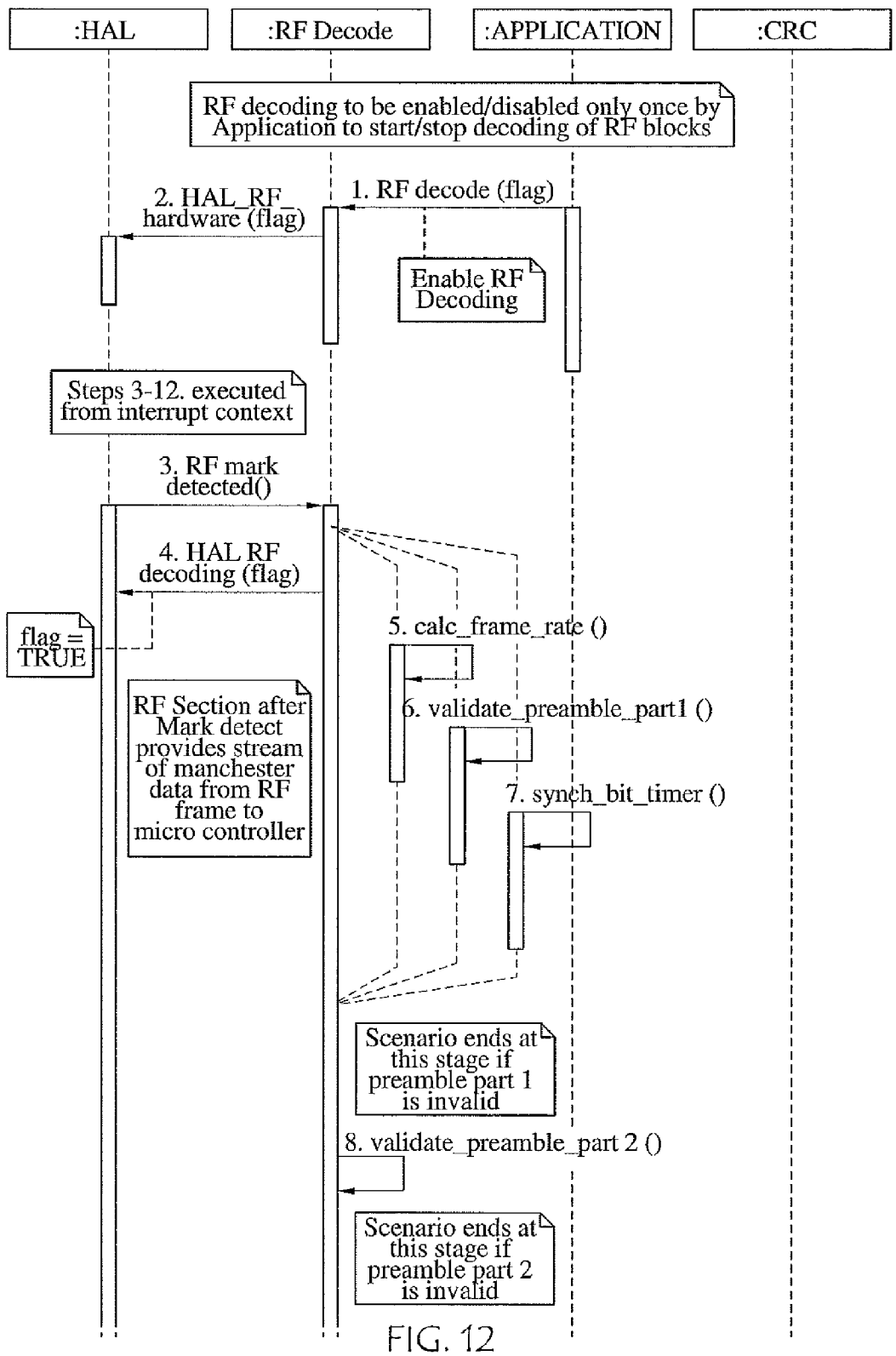
FIG. 12 is a high level sequence diagram of an embodiment of RF data frame and block decoding and error correction method of the present invention, as shown in FIG. 6.
Figure 12:
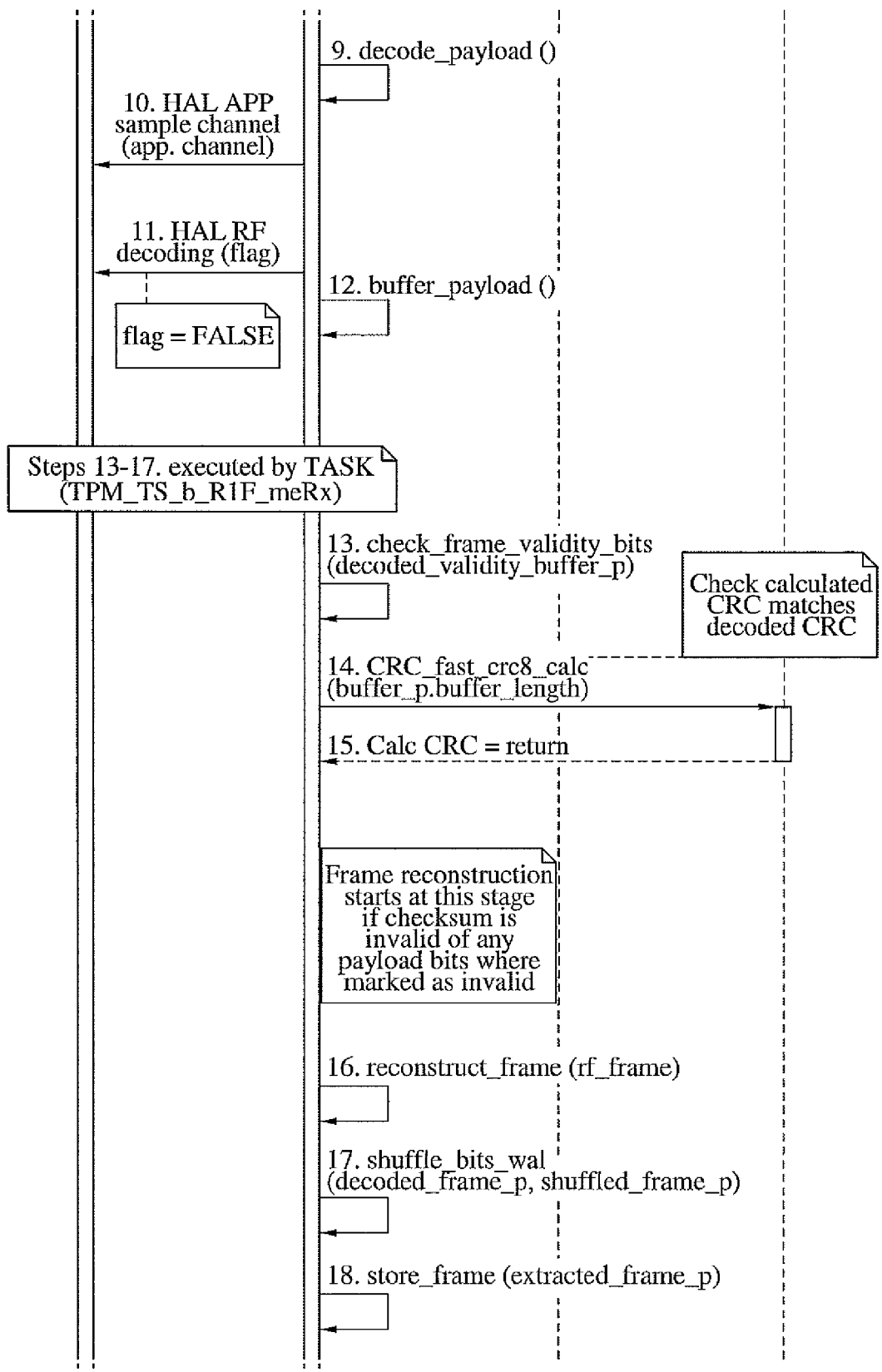
Figure 12:
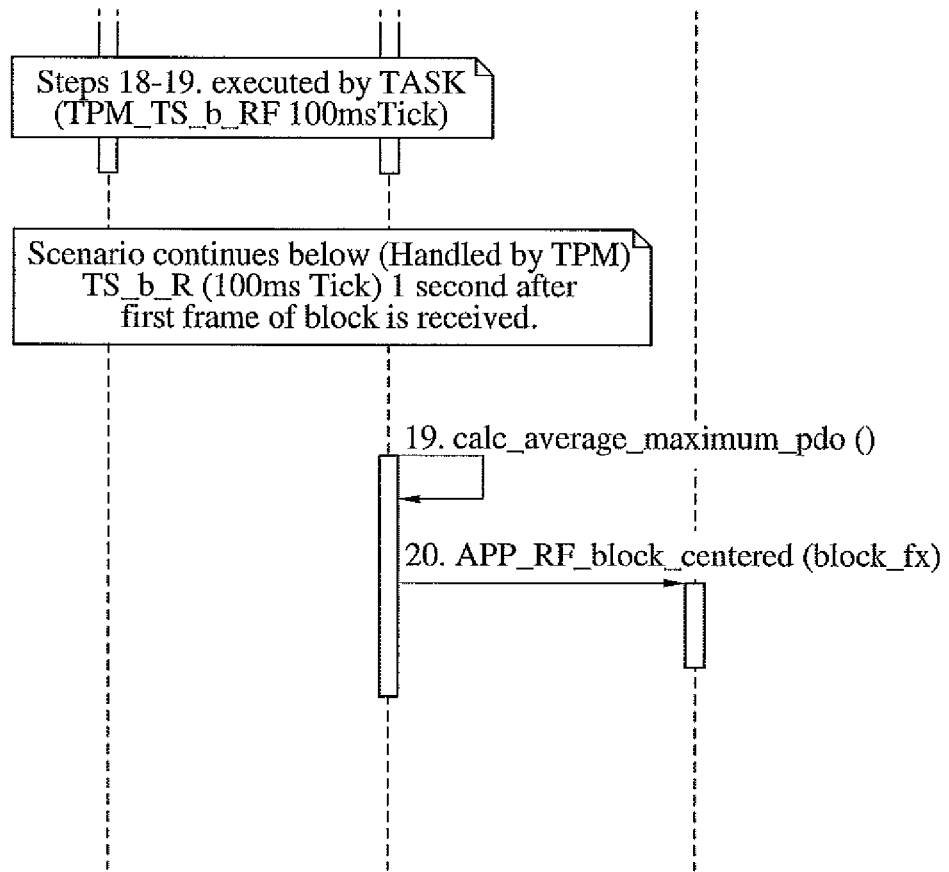

Still referring to FIG. 11, during the frame decoding process, any bit where the TPMS processor did not detect any edges is marked as invalid. Frame reconstruction is processor intensive, so method embodiments of the present invention may filter-out as many invalid frames that are most likely beyond recovery as possible. These may include any frames with invalid bits in the checksum or any frames with an invalid bit count above a certain programmable threshold. In other words, a threshold may be provided in the TPMS software that defines the maximum allowable corruption in a frame. If the degree of frame corruption (i.e., number of invalid bits) exceeds this threshold, the frame may be discarded. Frame reconstruction may be performed by using a cyclic redundancy check algorithm if the like which may try every possible combination of binary code in the frame locations where decoded bits were marked as invalid and then recheck using programmable boundary parameters, such as the checksum or a checksum algorithm. If the checksum passes, then that frame is stored and the number of possible solutions is incremented. All possible frame combinations may be tested. If only one solution is found, then the frame may be considered successfully reconstructed and may be passed. If there are no solutions or if there is more than one possible solution then the frame may be considered to be unreconstructable and the frame may be discarded. During testing of an embodiment of the present method, the task times tabulated were measured for the frame processing with various levels of frame reconstruction enabled.

| Max number of invalid bits | Task Time ms |
|---|---|
| 0 | 0.16 |
| 1 | 0.7 |
| 2 | 0.8 |
| 3 | 1.1 |
| 4 | 1.8 |
| 5 | 3.3 |
| 6 | 6.6 |
| 7 | 15.2 |

Figure 16:
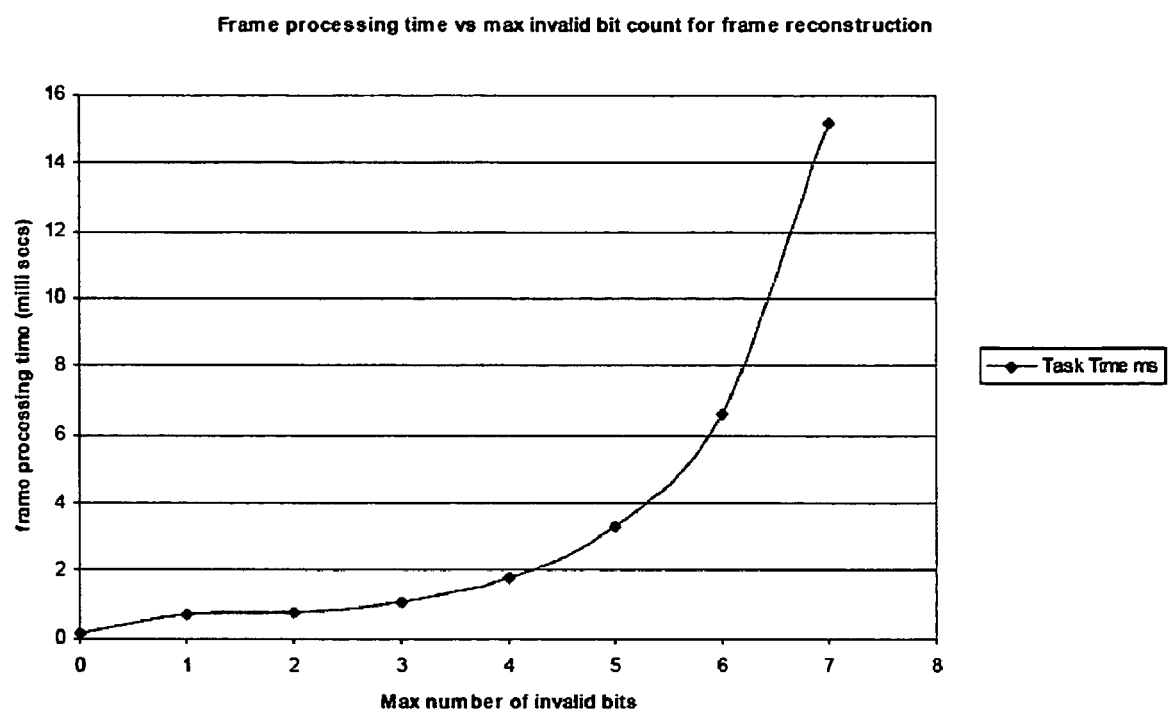
FIG. 16 is graph showing, by way of example, TPMS data frame processing time as a function of the maximum number of invalid bits in the frame.

FIG. 16 shows frame processing time as a function of the maximum number of invalid bits in the frame. In this example frames are received every 16 ms. However, free processing time between frames is used to service other operating system tasks, so the maximum processing time for a frame is fixed at 2 ms in this example. The maximum number of invalid bits in a frame to be reconstructed is set to four bits in the illustrated example. Accordingly, in a worst case scenario, with frames constantly incoming, all of which are invalid with four invalid bits, then 2 ms/16 ms or 12.5% of the processing power will be used up processing frames in this example.

As seen in FIG. 6, frame decoding may continue until the end of the TPMS data block is reached. A TPMS data block may be transmitted over the period of one second. In other words, one second after the first data frame is received in the TPMS receiver, the block is complete. The data block can then be passed onto the rest of the TPMS application. Frames should be consistent within the same block, and a check is preferably made to ensure this. At the end of block processing, the average maximum PDO measurement is preferably calculated (11) and block processing may then be complete.

As one of ordinary skill in the art should appreciate in light of the foregoing description and accompanying Figures programming code can be written to implement embodiments of the present method. The programming language and the actual instructions used may depend on the TPMS processor used, the operating system, and on the preferences of the programmer.

As noted above, although embodiments of the various steps of the methods of the present invention have been described with respect to a remote tire pressure monitoring system, various embodiments of the present methods can be used with a variety of RF data link where improved data quality is an objective.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for correcting errors in a block of digital data transmitted over a wireless link that is a part of a Tire Pressure Monitoring System (TPMS), the data block comprising a plurality of transmitted data frames, and each data frame including at least one sequence of data bits, the method comprising:
  a. identifying valid data frames and corrupted data frames by measuring a data corruption level for each transmitted data frame by detecting a number and position of invalid data bits in the transmitted data frame, the number of invalid data bits detected using edge detection windows, said edge detection windows determined by detecting an edge of a one bit and an edge of a subsequent bit of said data frame;
  b. comparing the measured data corruption level for each corrupted data frame to a data corruption threshold;
  c. reconstructing the corrupted data frames having a data corruption level below the data corruption threshold;
  d. reconstructing the data block using data from valid and reconstructed data frames; and
  e. verifying the data in the reconstructed data block,
wherein determination of said edge detection windows further comprises:
  determining if a bit time between said one bit and said subsequent bit is within predetermined tolerances;
  using said bit time between said one bit and said subsequent bit as an edge detection window if said bit time between said one bit and said subsequent bit is within said predetermined tolerances; and
  using a predetermined nominal bit time as said edge detection window if said bit time between said one bit and said subsequent bit is not within said predetermined tolerances.

2. The method of claim 1 wherein measuring the data corruption level further comprises time synchronizing the edge detection windows after detection of each data bit.

3. The method of claim 1 wherein said one bit and said subsequent bit are a part of the preamble of said frame.

4. A method for detecting and correcting data errors in a wireless link that is part of a Tire Pressure Monitoring System (TPMS), the method comprising:
   (a) detecting data errors in encoded data frames received over the wireless link, wherein the encoded data frames comprise symbols, by examining whether the symbols are received over finite time intervals, said finite time intervals determined by detecting an edge of a one bit and an edge of a subsequent bit in said data frame;
   (b) designating symbols not received over the finite time intervals as data errors;
   (c) correcting the detected data errors that fall within a detected error threshold; and
   (d) validating data frames containing corrected data errors by checking the corrected data frames against programmable boundary parameters,
   wherein determination of said finite time intervals further comprises:
      determining if a bit time between said one bit and said subsequent bit is within predetermined tolerances;
      using said bit time between said one bit and said subsequent bit as an finite time interval if said bit time between said one bit and said subsequent bit is within said predetermined tolerances; and
      using a predetermined nominal bit time as said finite time interval if said bit time between said one bit and said subsequent bit is not within said predetermined tolerances.

5. The method of claim 4, wherein the symbols have a period, and wherein the finite time intervals have a duration of one symbol period.

6. The method of claim 4, wherein said detecting the bit edges is used to determine an edge detection window over the finite time interval.

7. The method of claim 6, wherein the edge detection window is resynchronized with the detection of every received symbol.

8. The method of claim 4, further comprising the symbols being Manchester encoded.

9. The method of claim 4, wherein said designating further comprises correcting detected errors by using a cyclic redundancy check algorithm.

10. The method of claim 4, wherein each detected data error has a location in the received data frame and the location of the data error is stored in a memory.

11. The method of claim 10, wherein an error correction algorithm is used to correct the data errors, the number of iterations computed by the error correction algorithm is reduced by recalling the locations of the data errors and attempting to correct the data frame by changing only the known data errors so that iterations of the error correction algorithm involving changes to known correct data will not be attempted.

12. The method of claim 4, further comprising implementing the error detection and correction methods in software.

13. The method of claim 4 wherein said one bit and said subsequent bit are a part of the preamble of said frame.

14. A method for detecting and correcting data errors in a wireless channel that is part of a Tire Pressure Monitoring System (TPMS), the method comprising:
   (a) detecting data errors in data frames received over the wireless channel, wherein the data frames comprise symbols, and wherein the data errors are detected by examining the presence of received symbols utilizing edge detection windows over finite time intervals, said edge detection windows over finite time intervals determined by detecting an edge of a one bit and an edge of a subsequent bit in said data frame;
   (b) determining if the detected data errors are correctable and discarding the data frames that contain uncorrectable data errors;
   (c) correcting detected data errors in the data frames containing correctable errors; and
   (d) validating corrected data frames by checking corrected data frames against boundary thresholds,
   wherein determination of said edge detection windows over finite time intervals further comprises:
      determining if a bit time between said one bit and said subsequent bit is within predetermined tolerances;
      using said bit time between said one bit and said subsequent bit as an edge detection window over a finite time interval if said bit time between said one bit and said subsequent bit is within said predetermined tolerances; and
      using a predetermined nominal bit time as said edge detection window over said finite time interval if said bit time between said one bit and said subsequent bit is not within said predetermined tolerances.

15. The method of claim 14, wherein in said detecting, the data frames have checksums and said determining further comprises using a data determination algorithm to manipulate only the detected data errors in the data frame while attempting to satisfy the checksum and subsequently storing any manipulated data frames that satisfy the checksum, wherein the received data frame is correctable only if exactly one manipulated data frame from the data determination algorithm satisfies the checksum.

16. The method of claim 15, wherein the data determination algorithm comprises a cyclic redundancy check algorithm.

17. The method of claim 14 wherein said one bit and said subsequent bit are a part of the preamble of said frame.

18. A method for detecting and correcting data errors in a wireless link that is part of a Tire Pressure Monitoring System (TPMS), the method comprising:
   (a) receiving Manchester encoded data frames over the wireless link, wherein the data frames have checksums and are comprised of symbols, the symbols each having a symbol period;
   (b) detecting errors in the received data frames by determining whether each symbol is present in the received data frame, wherein each data error has a location in the received data frame and the presence of each symbol is detected by utilizing edge detection windows having a duration of one symbol period, said one symbol period determined by detecting an edge of a one bit and an edge of a subsequent bit in a preamble of said data frame, the symbols in the received data frame marked as data errors if the edge detection window closes without a symbol being detected;
   (c) storing the location of each data error in a memory;
   (d) discarding data frames if the number of data errors exceeds a programmable threshold level;
   (e) determining if the data frames are correctable by utilizing a data correction algorithm, wherein the data correction algorithm recalls and changes only the data errors in an attempt to satisfy the checksum so that the number of iterations used by the data correction algorithm in attempting to satisfy the checksum is reduced by not attempting iterations with changes to known good data, and wherein all modified data frames that satisfy the checksum are stored to the memory;

(f) correcting the received data frames if only exactly one modified data frame satisfies the checksum and discarding all other uncorrectable data frames; and (g) validating the corrected data frames against programmable boundary thresholds wherein determination of said one symbol period further comprises:

determining if a bit time between said one bit and said subsequent bit is within predetermined tolerances;

using said bit time between said one bit and said subsequent bit as said one symbol period if said bit time between said one bit and said subsequent bit is within said predetermined tolerances; and using a predetermined nominal bit time as said one symbol period if said bit time between said one bit and said subsequent bit is not within said predetermined tolerances.

19. The method of claim 18, wherein in said correcting discards the received data frames if the number of data errors exceeds four.

20. The method of claim 18, wherein in said data correction algorithm is a cyclic redundancy check algorithm.

21. The method of claim 18, wherein the method for detecting and correcting data errors is implemented in software.

* * * * *